(12) United States Patent
Chen et al.

(10) Patent No.: US 9,105,641 B2
(45) Date of Patent: Aug. 11, 2015

(54) PROFILE CONTROL IN INTERCONNECT STRUCTURES

(71) Applicant: INTERNATIONAL BUSINESS MACHINES CORPORATION, Armonk, NY (US)

(72) Inventors: Shyng-Tsong Chen, Patterson, NY (US); Samuel S. Choi, Beacon, NY (US); Steven J. Holmes, Albany, NY (US); David V. Horak, Essex Junction, VT (US); Charles W. Koburger, III, Delmar, NY (US); Wai-Kin Li, Beacon, NY (US); Christopher J. Penny, Poughkeepsie, NY (US); Shom Ponoth, Gaithersburg, MD (US); Chih-Chao Yang, Glenmont, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/486,493

(22) Filed: Sep. 15, 2014

(65) Prior Publication Data
US 2015/0035154 A1 Feb. 5, 2015

Related U.S. Application Data

(62) Division of application No. 13/562,953, filed on Jul. 31, 2012, now Pat. No. 8,835,305.

(51) Int. Cl.
*H01L 23/12* (2006.01)
*H01L 21/4763* (2006.01)
*H01L 23/532* (2006.01)
*H01L 23/48* (2006.01)
*H01L 21/768* (2006.01)

(Continued)

(52) U.S. Cl.
CPC .... *H01L 23/53295* (2013.01); *H01L 21/76807* (2013.01); *H01L 21/76813* (2013.01); *H01L 21/76831* (2013.01); *H01L 21/76844* (2013.01); *H01L 23/481* (2013.01); *H01L 23/528* (2013.01); *H01L 23/5226* (2013.01)

(58) Field of Classification Search
CPC .................. H01L 21/76807; H01L 21/76843; H01L 21/76802; H01L 21/76877; H01L 21/76838; H01L 23/53295; H01L 23/5329; H01L 23/5226; H01L 2221/1031; H01L 23/481; H01L 23/528; H01L 21/76831; H01L 21/76813
See application file for complete search history.

(56) References Cited

U.S. PATENT DOCUMENTS

| | | | |
|---|---|---|---|
| 6,187,666 B1 | 2/2001 | Singh et al. | |
| 6,259,160 B1 | 7/2001 | Lopatin et al. | |
| 6,383,929 B1 | 5/2002 | Boettcher et al. | |

(Continued)

FOREIGN PATENT DOCUMENTS

JP 2001244334 9/2001

*Primary Examiner* — Alonzo Chambliss
(74) *Attorney, Agent, or Firm* — Scully, Scott, Murphy & Presser, P.C.; Catherine Ivers, Esq.

(57) ABSTRACT

The profile of a via can be controlled by forming a profile control liner within each via opening that is formed into a dielectric material prior to forming a line opening within the dielectric material. The presence of the profile control liner within each via opening during the formation of the line opening prevents rounding of the corners of a dielectric material portion that is present beneath the line opening and adjacent the via opening.

12 Claims, 8 Drawing Sheets

(51) Int. Cl.
*H01L 23/522* (2006.01)
*H01L 23/528* (2006.01)

(56) References Cited

U.S. PATENT DOCUMENTS

| | | |
|---|---|---|
| 6,399,992 B1 | 6/2002 | Matsumoto et al. |
| 6,624,516 B2 * | 9/2003 | Fujisawa et al. ............. 257/762 |
| 7,105,437 B2 | 9/2006 | Farnworth et al. |
| 7,399,706 B2 | 7/2008 | Omoto et al. |
| 7,964,502 B2 | 6/2011 | Dao et al. |
| 8,097,492 B2 | 1/2012 | Magerlein et al. |
| 8,178,950 B2 | 5/2012 | Dao et al. |
| 8,232,196 B2 | 7/2012 | Yang et al. |
| 2005/0275005 A1 | 12/2005 | Choi et al. |
| 2007/0205482 A1 | 9/2007 | Yang et al. |
| 2008/0128907 A1 | 6/2008 | Yang et al. |
| 2008/0246151 A1 * | 10/2008 | Yang et al. .................... 257/751 |
| 2009/0289368 A1 | 11/2009 | Yang et al. |
| 2009/0309226 A1 | 12/2009 | Horak et al. |
| 2010/0327446 A1 | 12/2010 | Yang et al. |
| 2013/0001789 A1 | 1/2013 | Yang et al. |
| 2013/0093089 A1 | 4/2013 | Yang et al. |

\* cited by examiner

PROFILE CONTROL IN INTERCONNECT STRUCTURES

BACKGROUND

The present disclosure relates to a semiconductor structure and a method of fabricating the same. More particularly, the present disclosure relates to a dual damascene interconnect structure in which the via profile of the interconnect structure is controlled and a method of fabricating the same.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum-based interconnects.

Within a typical dual damascene interconnect structure, metal vias run perpendicular to the semiconductor substrate and metal lines run parallel to the semiconductor substrate. Typically, the metal vias are present beneath the metal lines and both features are embedded within a dielectric material.

Although methods of forming such dual damascene interconnect structures are known, further improvements are needed to provide interconnect structures that are highly reliable and dependable.

SUMMARY

In the present disclosure, the profile of a via can be controlled by forming a profile control liner within each via opening that is formed into a dielectric material prior to forming a line opening within the dielectric material. The presence of the profile control liner within each via opening during the formation of the line opening prevents rounding of the corners, i.e., chamfering, of a dielectric material portion that is present beneath the line opening.

In one aspect of the present disclosure, a method of forming an interconnect structure of the dual damascene type is provided. The method of the present disclosure includes forming a first dielectric material having at least one conductive region embedded therein. A second dielectric material is formed above the first dielectric material and the conductive region. Next, a via opening is formed in the second dielectric material and thereafter a profile control liner is formed on exposed surfaces within the via opening located in the second dielectric material. A line opening is then formed in the second dielectric material. The line opening is connected with the via opening, and the profile control liner remains on the exposed surfaces within the via opening during the forming of the line opening. Next, an upper surface of the at least one conductive region within the first dielectric material is exposed by removing at least a portion of the profile control liner within the via opening. A diffusion barrier liner is formed within the line opening and the via opening, and then a conductive material is formed within remaining portions of the line opening and the via opening.

In another aspect of the present disclosure, an interconnect structure is provided. The interconnect structure of the present disclosure includes a dielectric material comprising a via opening and a line opening, wherein the line opening is located above and connected to the via opening. The interconnect structure of the present disclosure further includes a profile control liner present at least partially on sidewalls of the dielectric material within the via opening. The interconnect structure of the present disclosure also includes a barrier liner located within the via opening and the line opening, and a conductive material located within remaining portions of the via opening and the line opening.

DETAILED DESCRIPTION

The present disclosure, which provides an interconnect structure in which the via profile of the interconnect structure is controlled and a method of fabricating of the same, will now be described in greater detail by referring to the following discussion and drawings that accompany the present application. Throughout the drawings, the same reference numerals or letters are used to designate like or equivalent elements. The drawings are not necessarily drawn to scale. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

In prior art integration schemes, the via portions of the interconnect structure are not protected during the trench, i.e., line, dielectric etch. As such, the trench dielectric etch will sputter the top corner and attack the via sidewalls, and hence result in rounding, i.e., chamfering, the top corners of the via. This problem is now depicted in FIG. 1, which illustrates a prior art dual damascene interconnect structure 100 that is prepared as described above. Specifically, the prior art interconnect structure 100 includes a first dielectric material 102 including a plurality of conductive regions 106 embedded therein. Each conductive region 106 is separated from the first dielectric material 102 by a diffusion barrier 104. The prior art interconnect structure further includes a dielectric capping layer 107 which includes openings therein which expose surfaces of some of the underlying conductive regions 106. Atop the dielectric capping layer 106 there is present a second dielectric material 108 that has a chamfered profile (e.g., rounded corners) 110 present in a dielectric material portion 108A of second dielectric material 108 which is present between two adjacent vias 112A, 112B. The chamfered profile 110 can also be referred to herein as simply rounded profile 110. Atop and connecting the two adjacent vias 112A, 112B there is present a line 114. The vias 112A, 112B and the line 114 include a second diffusion barrier 116 that lines sidewalls of the vias 112A, 112B, and the line 114 and they are filled with a conductive material 118. In such an interconnect structure, the line-to-line spacing, A, is no longer always the minimum distance between interconnects. Instead, it has been observed that the profile of the dielectric material portion 108A located between adjacent vias 112A, 112B now defines the minimum distance, B, in such an interconnect structure.

Figure 1:
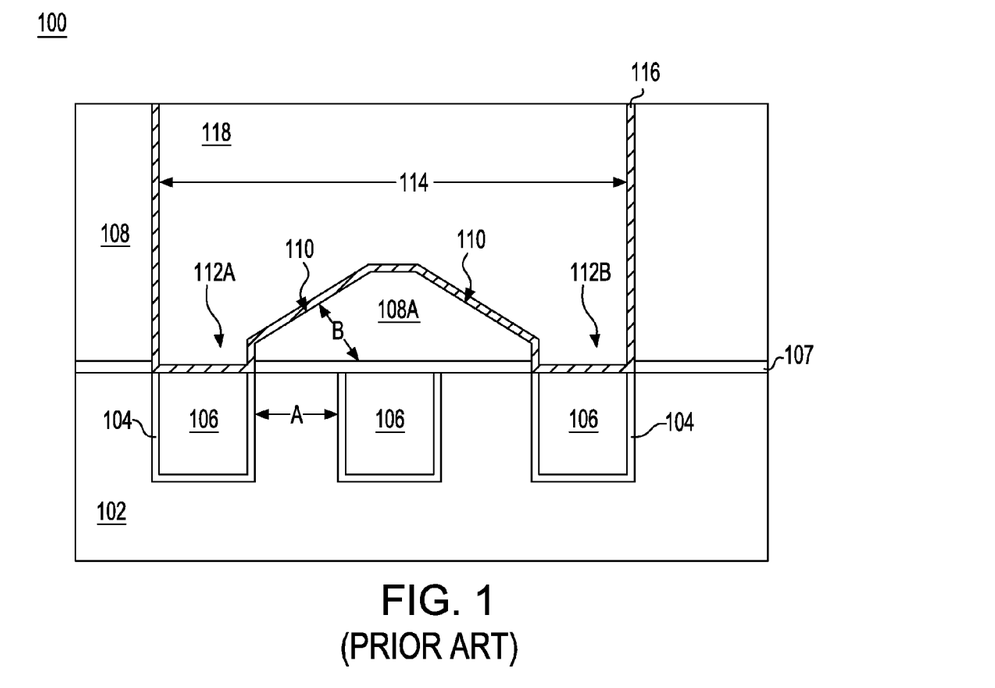
FIG. 1 is a pictorial representation (through a cross sectional view) illustrating a prior art dual damascene interconnect structure in which profile tapering occurs to a dielectric material portion which is present between two adjacent conductively filled vias.

The degree of chamfering of a given integration scheme can be measured in several ways. One way is to measure the chamfer is by the length of the rounded profile 110. A longer rounded profile 110 is high chamfering and not desired. A shorter or no rounded profile 110 length is low chamfering and desired. Referring to FIG. 1, the prior art shows a long rounded profile 110 length whereas an embodiment of the present disclosure shown in FIG. 10A or FIG. 10B essentially has no rounded profile (note that no rounding corners are visible within dielectric material portion 20A) so the length is zero. To be an acceptable rounded profile 110 length (i.e., substantially no chamfer), a length can be from about 2 nm to 70 nm. A second way to measure the degree of chamfering is by comparing the length of the rounded profile 110 to the distance between metal lines (A) at the metal level immediately below the current level. Referring to FIG. 1, the length of the rounded profile 110 is longer than the distance between metal lines A, this is not desired. In contrast, an embodiment of the present disclosure shown in FIG. 10A or FIG. 10B, the rounded profile length is less than the spacing between the regions including conductive material 16. A third way to measure chamfering is by the height of a vertical portion of the via opening at the intersection of the via opening and the metal line opening and compare the height to the length of the rounded profile 110. Referring to prior art FIG. 1, the height of the via opening 112A where it is adjacent second dielectric portion 106A (i.e., where the via opening 112A and the line opening 118 intersect) relative to the length of rounded profile 110 is very small, well under 1 (meaning the length of the rounded profile is at least as long if not longer than the via opening height at the intersection). In contrast, the embodiment of the present disclosure shown in FIG. 10A of FIG. 10B, the via height at the intersection is infinitely greater than the chamfer. Using this third chamfering metric, substantially no chamfering exists when the ratio of via height at the intersection to length of rounded profile is greater than 1, and preferably is greater than 2. A fourth way to measure chamfer is by chamfer angle. The chamfer angle metric can be used when there is no completely vertical portion of the via 112A sidewall adjacent the second dielectric portion 108A. In such cases, the chamfer angle is the angle that the rounded profile 110 makes with a horizontal surface. Referring to FIG. 1, assume that there is no vertical portion of the via 112A adjacent second dielectric portion 108A. In such a case, rounded profile 110 extends to the capping layer 107. The angle between the horizontal surface, capping layer 107 and the rounded profile 110 is the chamfer angle. Chamfer angles less than 45 degrees are not desired. Chamfer angles greater than 45 degrees are acceptable, preferably the angle is greater than 60 degrees. Substantially no chamfer would exist at chamfer angels greater than about 60 degrees.

Typically, the vias 112A, 112B are referred to as first level via, V1, while conductive regions 106 are referred to as a first level of metal, M1. It has been observed that uncontrolled via chamfering increases the risk of V1 to M1 shortening, and results in poor electrical yield and low reliability. As such, a method is needed in which the profile of the via can be controlled in such a manner as to minimize rounding, i.e., chamfering, the top corners of the dielectric material portion that defines the via of an interconnect structure.

In the present disclosure, the profile of a via can be controlled by forming a profile control liner within each via opening that is formed into a dielectric material prior to forming a line opening within the dielectric material. The presence of the profile control liner within each via opening during the formation of the line opening prevents rounding of the corners of a dielectric material portion that is present between the line opening and adjacent the via opening. This aspect of the present disclosure is now described in greater detail.

Figure 2:
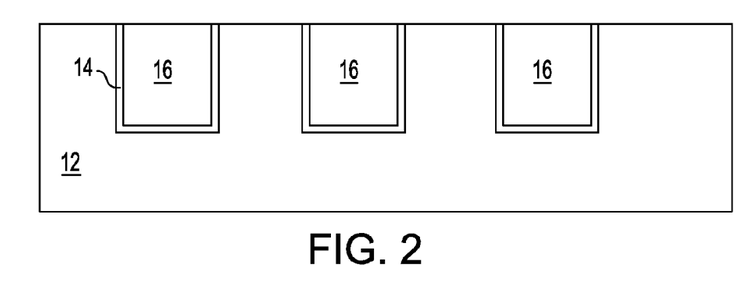
FIG. 2 is a pictorial representation (through a cross sectional view) illustrating a first dielectric material including regions of conductive material embedded therein.

Referring to FIG. 2, there is illustrated initial structure that can be employed in one embodiment of the present disclosure. The initial structure shown in FIG. 2 represents a first level of an interconnect structure. The initial structure that can be employed in the present disclosure can include a first dielectric material 12 that has at least one region of a conductive material 16 embedded. Each region of conductive material 16 is separated from the first dielectric material 12 by a diffusion barrier 14.

The first dielectric material 12 is typically located upon a substrate (not shown in the drawings of the present application). The substrate, which is not shown, may comprise a semiconducting material, an insulating material, a conductive material or any combination including multilayers thereof. When the substrate is comprised of a semiconducting material, any semiconductor such as, for example, Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs). In some embodiments of the present disclosure, the semiconducting material may include one or more semiconductor devices such as, for example, complementary metal oxide semiconductor (CMOS) devices fabricated thereon.

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers.

When the substrate comprises a combination of an insulating material and a conductive material, the substrate may represent one of interconnect levels of a multilayered interconnect structure.

The first dielectric material 12 of the initial structure may include any interlevel or intralevel dielectric material including inorganic dielectrics or organic dielectrics. The first dielectric material 12 may be porous, non-porous or contain regions and/or surfaces that are porous and other regions and/or surfaces that may be non-porous. Some examples of suitable dielectrics that can be used as the dielectric material 12 include, but are not limited to, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the first dielectric material 12 has a dielectric constant that is less than silicon dioxide, i.e., less than 4.0. In another embodiment, the first dielectric material 12 that can be employed in the present disclosure has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of 4.0.

The thickness of the first dielectric material 12 may vary depending upon the composition of the dielectric material used as well as the exact number of dielectric layers within the first dielectric material 12. In one embodiment, the dielectric material 12 has a thickness from 50 nm to 1000 nm. In other embodiments, the first dielectric material 12 can have a thickness that is greater than or less than the thickness range mentioned above. The first dielectric material 12 can be formed utilizing a deposition process such as, for example, chemical vapor deposition (CVD), plasma enhanced chemical vapor deposition (PECVD), evaporation, chemical solution deposition and spin-on coating.

In some embodiments of the present disclosure and after forming the first dielectric material 12, a hard mask material (not shown) can be formed on an exposed surface of dielectric material 12. In other embodiments, the hard mask material is not employed.

When employed, the hard mask material may include an oxide, nitride, oxynitride or multilayers thereof (e.g., a stack comprising at least two hard mask materials). In one embodiment, the hard mask material comprises a semiconductor oxide such as, for example, silicon dioxide. In another embodiment, the hard mask comprises a stack of an oxide hard mask material such as, for example, silicon dioxide, and a nitride hard mask material such as, for example, silicon nitride. In some embodiments, the hard mask material may be formed utilizing a deposition process including, for example, CVD, PECVD, evaporation, chemical solution deposition, physical vapor deposition (PVD) and atomic layer deposition (ALD). In other embodiments, the hard mask material can be formed by a thermal process such as, for example, thermal oxidation, and/or thermal nitridation. In yet other embodiments, the hard mask material can be formed utilizing a combination of deposition and thermal processes. The thickness of the hard mask material may vary depending on the composition of the hard mask material itself as well as the technique that was used in forming the same. Typically, the hard mask material has a thickness from 10 nm to 80 nm.

Next, at least one opening can be formed into the first dielectric material 12. In one embodiment, the hard mask material is employed as a pattern mask. The at least one opening may include a via opening, a line opening, a combined via and line opening, or any combination thereof. A via opening can be distinguished from a line opening in that the via opening has a narrower width than the line opening.

In one embodiment and as shown in FIG. 2, the at least one opening extends partially through the first dielectric material 12. In another embodiment (not shown), the at least one opening can extend entirely through the first dielectric material 12, i.e., from the upper surface of the first dielectric material 12 to the bottom surface of the first dielectric material 12. In some embodiments, a first set of openings can extend partially through the first dielectric material 12, while a second set of openings can extend entirely through the first dielectric material 12.

The at least one opening can formed by lithography and etching. The lithographic step may include forming a photoresist (organic, inorganic or hybrid) atop the first dielectric material 12. In one embodiment, the photoresist can be formed directly on the upper surface of the first dielectric material 12. In another embodiment, and when the hard mask material is present, the photoresist can be formed directly on the upper surface of the hard mask material. The photoresist can be formed utilizing a deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step can be performed to transfer the pattern from the patterned photoresist into at least the first dielectric material 12. In one embodiment, and when the hard mask material is present, the pattern may be first transferred into the hard mask material and then into the first dielectric material 12. In such an embodiment, the patterned photoresist is typically, but not necessarily always, removed from the surface of the structure after transferring the pattern into the hard mask material utilizing a resist stripping process such as, for example, ashing. The etching step used in forming the at least one opening may include a dry etching process (including, for example, reactive ion etching, ion beam etching, plasma etching or laser ablation), a wet chemical etching process or any combination thereof. In one embodiment, reactive ion etching is used to form the at least one opening.

Each opening that is formed into the first dielectric material 12 is then filled with a diffusion barrier material 14 and a conductive material. As illustrated in FIG. 2, the diffusion barrier 14 and each region of conductive material 16 have an upper surface that is coplanar with an upper surface of the first dielectric material 12. The diffusion barrier 14 that is within the each of the openings is U-shaped. The term "U-shaped" as used throughout the present disclosure denotes any contiguous material such as diffusion barrier 14 that includes two vertical portions which upward extend from a horizontal connecting portion.

The diffusion barrier 14 can include any material that can serve as a barrier to prevent conductive material ions from diffusing into the first dielectric material 12. Examples of materials that can be used as diffusion barrier 14 include, for example, Ta, TaN, Ti, TiN, Ru, RuN, RuTa, RuTaN, IrTa, IrTaN, W, WN or a multilayered stack thereof. The thickness of the diffusion barrier 14 may vary depending on the deposition process used as well as the material employed. Typically, the diffusion barrier 14 has a thickness from 4 nm to 40 nm, with a thickness from 7 nm to 20 nm being more typical. The diffusion barrier 14 can be formed by a deposition process including, for example, CVD, PECVD, PVD, sputtering and plating.

Each region of conductive material 16 includes for example, polySi, SiGe, a conductive metal, an alloy comprising at least two conductive metals, a conductive metal oxide, a conductive metal nitride, a conductive metal silicide or any combination thereof. In one embodiment, each region of conductive material 16 can comprise Al, W, Cu and/or a Cu alloy (such as AlCu). Each region of conductive material 16 can be formed by a deposition process including, for example, CVD, PECVD, PVD, sputtering, plating, chemical solution deposition and electroless plating.

After deposition of each of the diffusion barrier 16 and the conductive material, any excess diffusion barrier material and conductive material that is located outside of the at least one opening can be removed by a planarization process. In one embodiment, the planarization process includes chemical mechanical polishing (CMP). In another embodiment, the planarization process includes grinding. In a further embodiment, the planarization process includes a combination of CMP and grinding. In some embodiments and when a hard mask material is employed, the planarization process also removes remaining portions of the hard mask material that are located outside the opening and on the upper surface of first dielectric material 12.

Figure 3:
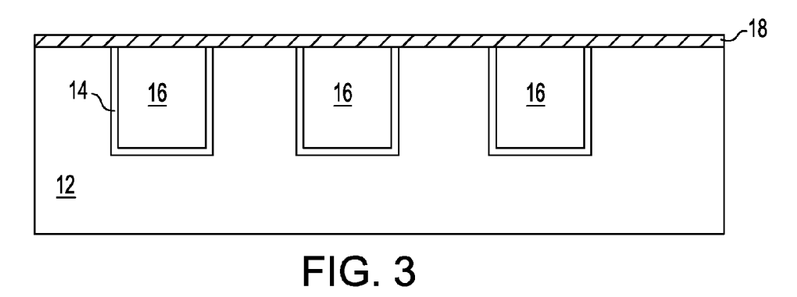
FIG. 3 is a pictorial representation (through a cross sectional view) illustrating the structure of FIG. 2 after forming a dielectric capping layer on an exposed surface of the first dielectric material as well as an exposed surface of each region of conductive material.

Referring now to FIG. 3, there is illustrated the structure of FIG. 2 after forming a dielectric capping layer 18 on an exposed surface of the first dielectric material 12 as well as an exposed surface of each region of conductive material 16. The dielectric capping layer 18 can be formed utilizing a deposition process such as, for example, CVD, PECVD, chemical solution deposition, or evaporation. The dielectric capping layer 18 may include any suitable dielectric capping material such as, for example, SiC, $Si_3N_4$, $SiO_2$, a carbon doped oxide, a nitrogen and hydrogen doped silicon carbide SiC(N,H) or multilayers thereof. The thickness of the dielectric capping layer 18 may vary depending on the technique used to form the same as well as the material make-up of the layer. Typically, the dielectric capping layer 18 has a thickness from 15 nm to 55 nm, with a thickness from 25 nm to 45 nm being more typical.

Figure 4:
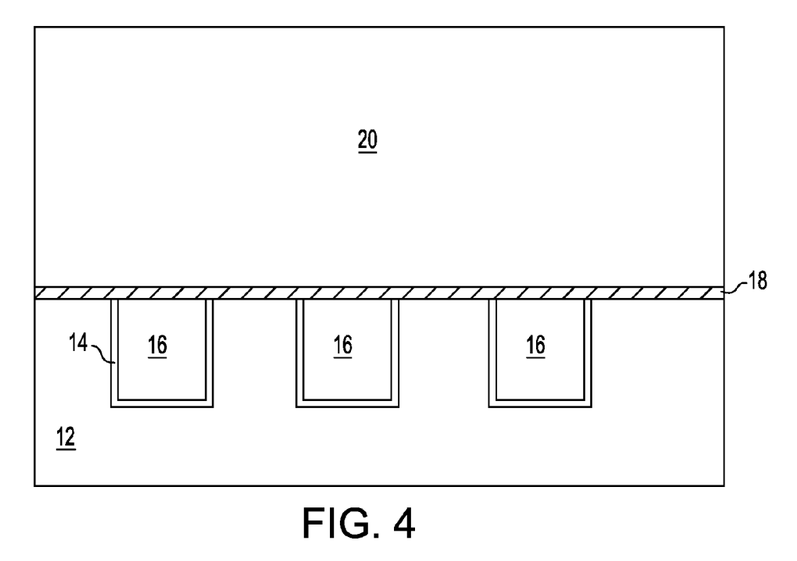
FIG. 4 is a pictorial representation (through a cross sectional view) illustrating the structure of FIG. 3 after forming a second dielectric material on an exposed surface of the dielectric capping layer.

Referring to FIG. 4, there is illustrated the structure of FIG. 3 after forming a second dielectric material 20 on an exposed surface of the dielectric capping layer 18. The second dielectric material 20 serves as a second level of the interconnect structure of the present disclosure. In one embodiment, the second dielectric material 20 may comprise a same dielectric material as that of the first dielectric material 12. In another embodiment of the present disclosure, the second dielectric material 20 includes a different dielectric material as that of the first dielectric material 12. The second dielectric material 20 can be formed utilizing one of the deposition techniques mentioned above in forming the first dielectric material 12. The thickness of the second dielectric material 20 can be within the ranges mentioned above for the first dielectric material 12.

Figure 5:
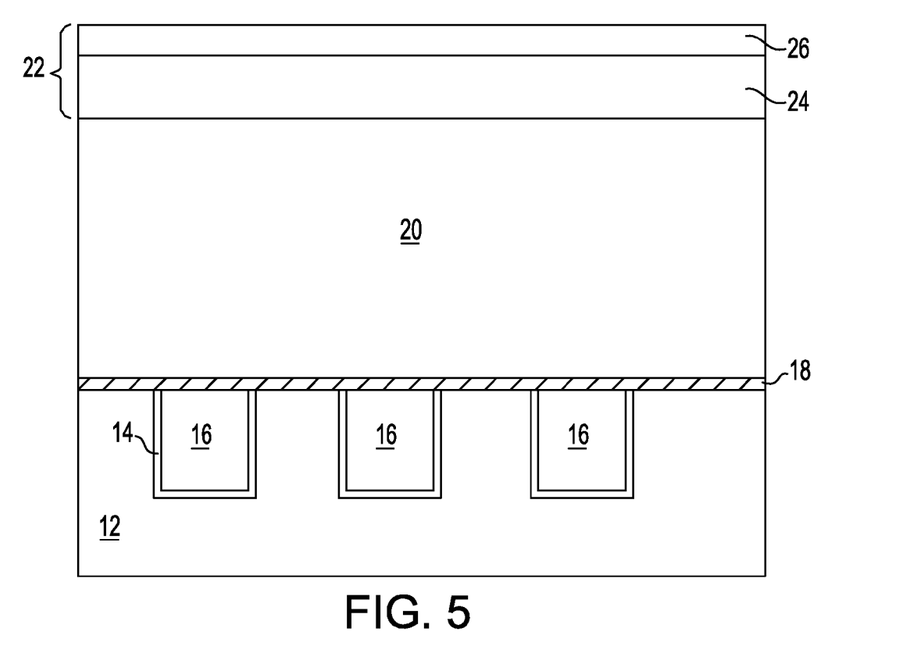
FIG. 5 is a pictorial representation (through a cross sectional view) illustrating the structure of FIG. 4 after forming a stack of mask materials including, from bottom to top, a dielectric hard mask material and a metal mask material on an exposed surface of the second dielectric material.

Referring to FIG. 5, there illustrated the structure of FIG. 4 after forming a stack of mask materials 22 including, from bottom to top, a dielectric hard mask material 24 and a metal mask material 26 on an exposed surface of the second dielectric material 20. The dielectric hard mask material 24 includes one of the materials mentioned above for the hard mask material that can be used in forming the at least one opening within the first dielectric material 12. The dielectric hard mask material 24 can be formed utilizing one of the techniques mentioned above that could be used for forming the hard mask material on the first dielectric material 12. The thickness of the dielectric hard mask material 24 is typically within a range from 5 nm to 80 nm, with a thickness from 10 nm to 40 nm being more typical.

The metal mask material 26 of the stack of mask materials 22 can include for example, Ta, TaN, Ti, TiN, W, and/or WN. The metal mask material 26 can be formed utilizing CVD, PECVD, PVD, sputtering and plating. The thickness of the metal mask material 26 is typically within a range from 4 nm to 70 nm, with a thickness from 8 nm to 40 nm being more typical.

Figure 6A:
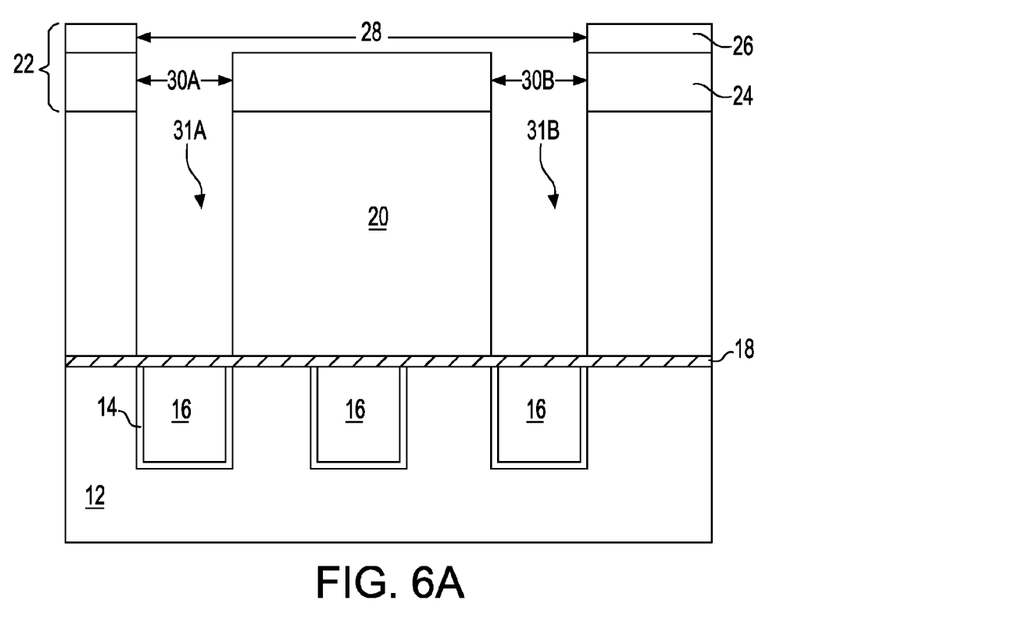
FIG. 6A is a pictorial representation (through a cross sectional view) illustrating the structure of FIG. 5 after forming a line pattern within the metal mask material and via patterns within the dielectric hard mask material and transferring the via patterns only into the second dielectric material such that via openings are provided which extend entirely through the second dielectric material.
Figure 6B:
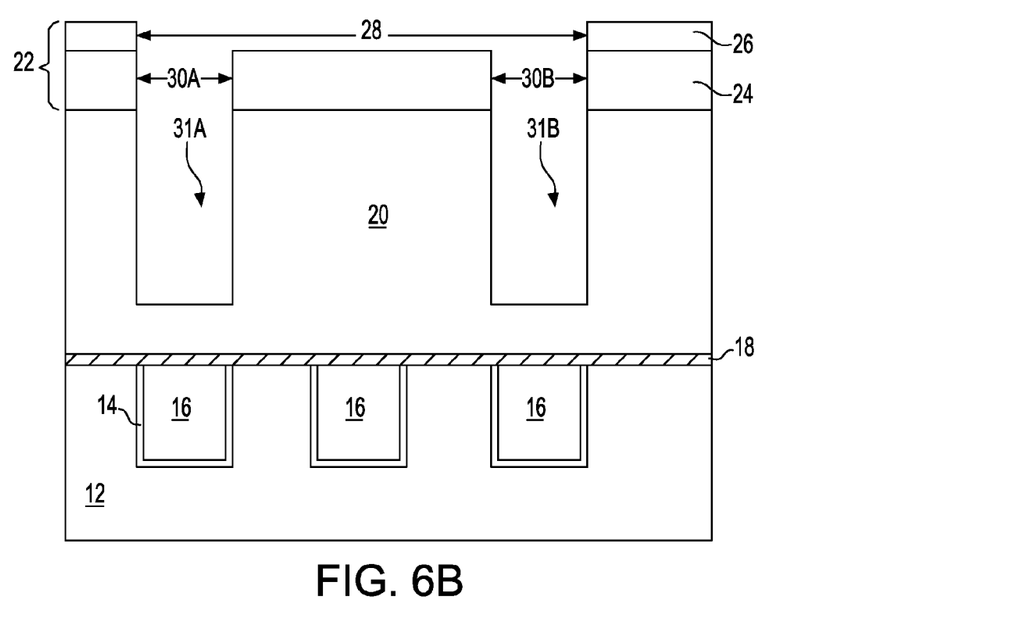
FIG. 6B is a pictorial representation (through a cross sectional view) illustrating the structure of FIG. 5 after forming a line pattern within the metal mask material and via patterns within the dielectric hard mask material and transferring the via patterns only into the second dielectric material such that via opening extend partially through the second dielectric material.

Referring to FIGS. 6A-6B, there are illustrated the structure of FIG. 5 after forming a line pattern 28 within the metal mask material 26 and via patterns 30A, 30B within the dielectric hard mask material 24 and transferring the via patterns 30A, 30B only into the second dielectric material 20 to provide via openings 31A, 31B within the second dielectric material 20. The line pattern is not transferred into the second dielectric material 20 at this point of the present disclosure. Although the drawings illustrate the formation of two via patterns within the dielectric hard mask material 24 the present disclosure is not limited to that number. Instead, a single via opening, or more than two via openings can be formed. Likewise, although the drawings show a single line pattern formed into the metal mask material 26, the present disclosure is not limited to that number. Instead, a plurality of line patterns can be formed into the metal mask material at this point of the present disclosure. In some embodiments of the present disclosure, not all via patterned are formed above a region of conductive material 16 present in the first dielectric material 12. In some embodiments, each via pattern is formed above a region of conductive material 16 within the first dielectric material 12.

In some embodiments, and as shown in FIG. 6A, each via opening 31A, 31B that is formed extends entirely through the second dielectric material exposing an upper surface of the dielectric capping layer. In other embodiments of the present disclosure and as shown in FIG. 6B, each via opening 31A, 31B does not extend entirely through the second dielectric material 20. In such an embodiment, a remaining portion of the second dielectric material 20 can be present between the bottom of each via opening 31A, 31A and the upper surface of the dielectric capping layer 18. In other embodiments, some of the via openings can extend entirely through the second dielectric material 20, while other of the via openings only extend partially through the second dielectric material.

In accordance with an aspect of the present disclosure, the line pattern 28 is formed into the metal mask material 26 prior to forming the via patterns into the dielectric hard mask material 28. The line pattern 28 can be formed into the metal mask material 26 by a first lithography step in which a first photoresist material is applied to an exposed surface of the metal mask material 26. The first photoresist material is then exposed to a line (or trench) pattern of radiation and then the exposed photoresist is developed utilizing a conventional resist developer. The line pattern that is formed into the first photoresist is then transferred to the metal mask material 26 utilizing an etching process which selectively removes the exposed portions of the metal mask material, stopping at an upper surface of the dielectric hard mask material 24. In one embodiment, the line pattern can be transferred from the patterned first photoresist into the metal mask material 26 by reactive ion etching. In some embodiments, the reactive ion etch may include chlorine chemistry. After transferring the line pattern to the metal mask material 26, the patterned first photoresist material is removed utilizing a conventional resist stripping process such as, for example, ashing.

Next, via patterns 30A, 30B can be formed into the dielectric hard mask material 24 by a second lithography step in which a second photoresist material is applied to an exposed surface of the metal mask material 26 which is now patterned to include the line pattern 28 and an exposed surface of the dielectric hard mask material 24. The second photoresist material is then exposed to via patterns of radiation and then the exposed photoresist is developed utilizing a conventional resist developer. The via patterns that are formed into the second photoresist are then transferred to the exposed portions of the dielectric hard mask material 24 utilizing an etching process which selectively removes the exposed portions of the dielectric hard mask material 24, stopping at an upper surface of the second dielectric material 20. In one embodiment, the via patterns 30A, 30B can be transferred from the patterned second photoresist into the dielectric hard mask material 24 by an anisotropic reactive ion etch. After transferring the via patterns 30A, 30B to the dielectric hard mask material 24, the patterned second photoresist material is typically removed utilizing a conventional resist stripping process such as, for example, ashing. Another etch can now be used to transfer the via patterns 30A, 30B within the dielectric hard mask material 24 to the underlying second dielectric material 20. In one embodiment, the another etch may comprise fluorine based chemistry. In some embodiments of the present disclosure, the via patterns 30A, 30B can be transferred into the dielectric hard mask material 24 and the underlying second dielectric material 20 in a single etch step in the presence of the patterned second photoresist.

Figure 7A:
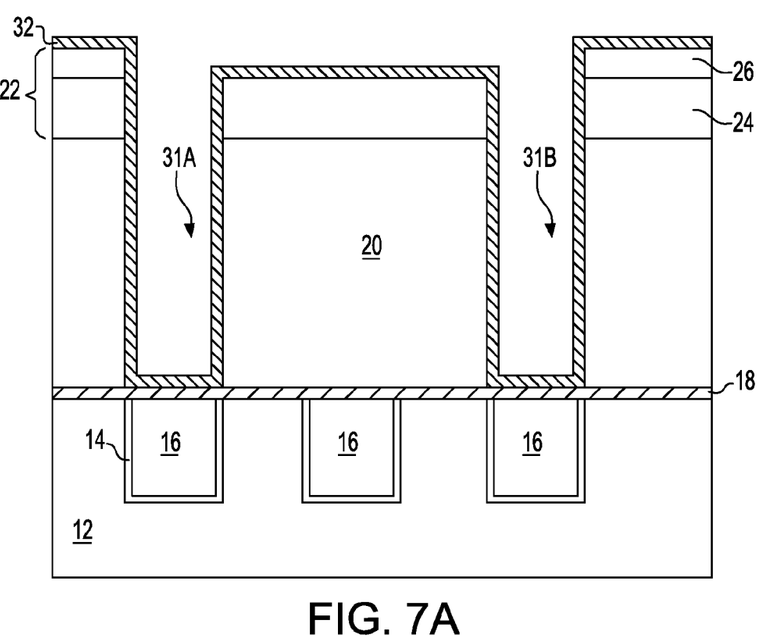
FIG. 7A is a pictorial representation (through a cross sectional view) illustrating the structure of FIG. 6A after forming a profile control liner within each via opening and on an exposed surface of remaining portions of the stack of mask materials.
Figure 7B:
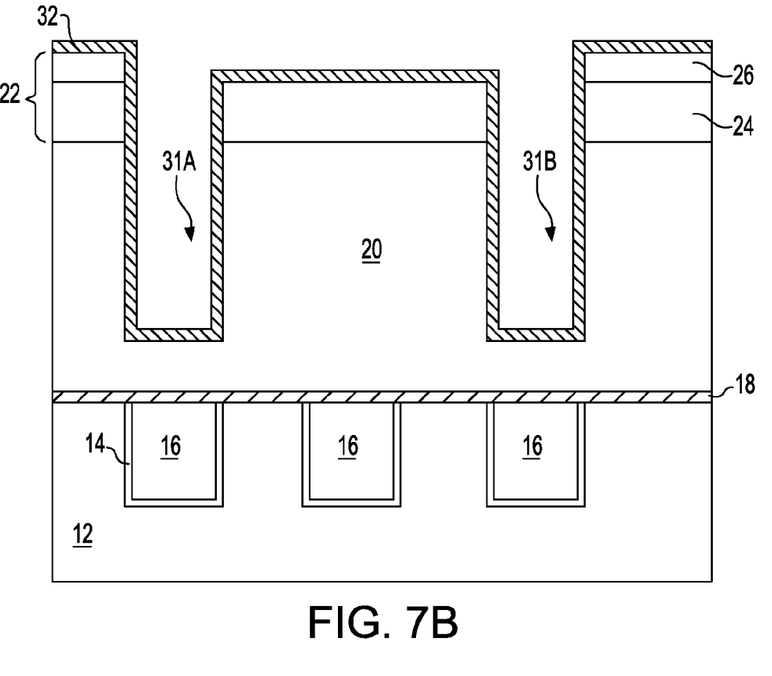
FIG. 7B is a pictorial representation (through a cross sectional view) illustrating the structure of FIG. 6B after forming a profile control liner within each via opening and on an exposed surface of remaining portions of the stack of mask materials.

Referring to FIGS. 7A-7B, there are illustrated the structures of FIGS. 6A-6B, respectfully, after forming a profile control liner 32 within each via opening 31A, 31B and on an exposed surface of remaining portions of the stack of mask materials 22. At this point of the present disclosure, the profile control liner 32 is a contiguous liner material that covers all exposed surfaces of the structure shown in FIGS. 6A-6B.

In one embodiment, the profile control liner 32 that can be employed in the present disclosure may comprise a material that prevents diffusion of a conductive material into the second dielectric material 20. Examples of such materials that can be used as the profile control liner 32 include, but are not limited to, Ta, TaN, Ti, TiN, Ru, RuN, RuTa, RuTaN, IrTa, IrTaN, W, and/or WN. In another embodiment, the profile control liner 32 that can be used includes a dielectric material such as, for example, silicon dioxide, silicon nitride, and/or silicon oxynitride.

The profile control liner 32 can be formed by CVD, PECVD, PVD, sputtering and plating. The thickness of the profile control liner 32 that can be used in the present disclosure is typically from 1 nm to 20 nm, with a thickness from 2 nm to 5 nm being even more typical.

Figure 8A:
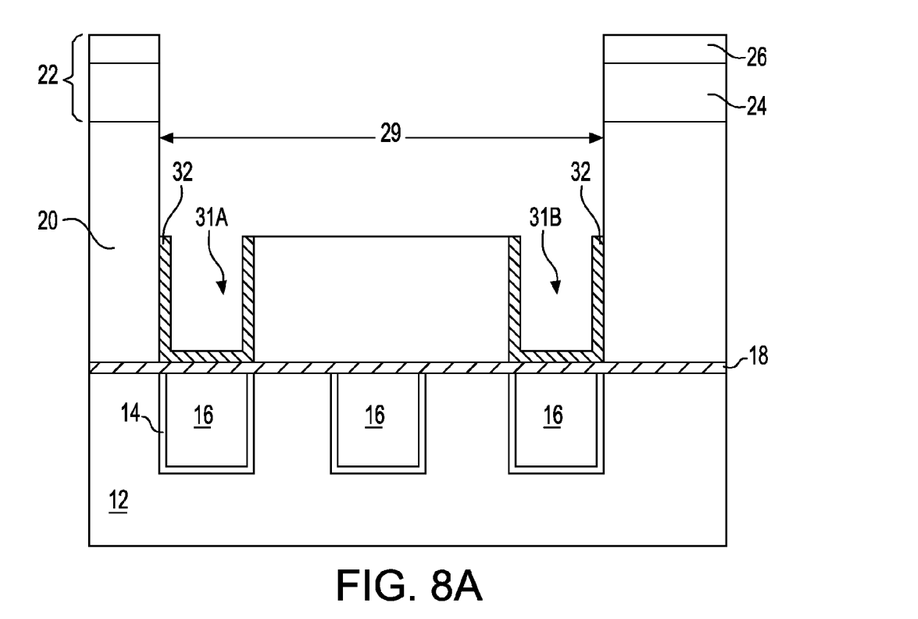
FIG. 8A is a pictorial representation (through a cross sectional view) illustrating the structure of FIG. 7A after transferring the line pattern that was previously formed into the metal hard mask material into the second dielectric material to provide a line opening within the second dielectric material that is located above and connected with the via openings.
Figure 8B:
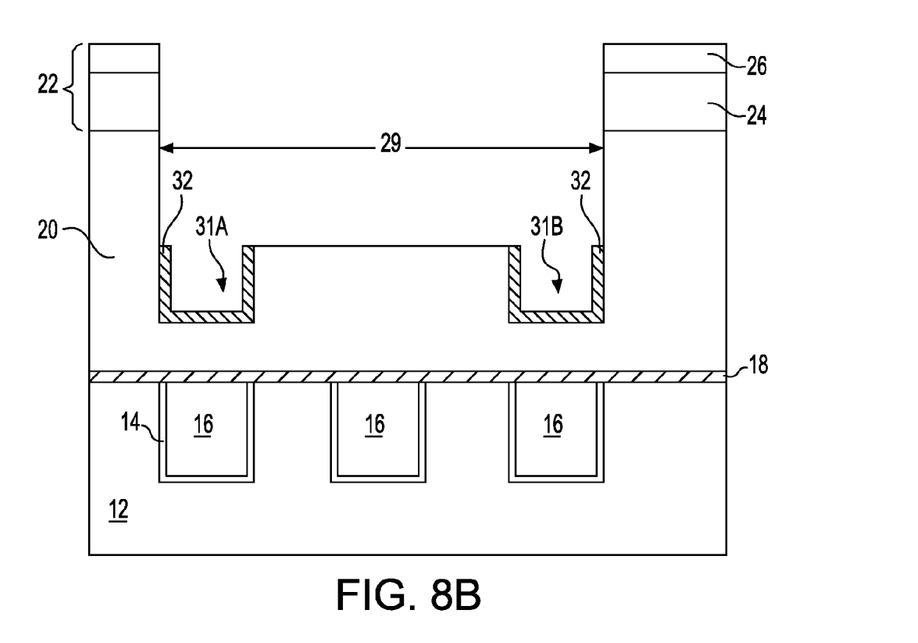
FIG. 8B is a pictorial representation (through a cross sectional view) illustrating the structure of FIG. 7B after transferring the line pattern that was previously formed into the metal hard mask material into the second dielectric material to provide a line opening within the second dielectric material that is located above and connected with the via openings.

Referring now to FIGS. 8A-8B, there are depicted the structure of FIGS. 7A-7B, respectively, after transferring the line pattern 28 that was previously formed into the metal hard mask material 26 into the second dielectric material 20 to provide a line opening 29 within the second dielectric material 20. The drawings shown in FIGS. 8A-8B are for embodiments in which the profile control liner 32 is a conductive material.

When a dielectric material is used as the profile control liner 32, the transferring of the line pattern 28 into the second dielectric material 20 also removes a portion of the dielectric material profile control liner from the bottom of the via as well as the underlying exposed portion of the dielectric capping layer 18. In embodiments in which a dielectric material profile control liner is used, the processing steps can be simplified since no additional steps are needed to remove the dielectric material profile control liner and the underlying portion of the dielectric capping layer from the structure. Instead, both are removed during the transferring the line pattern 28 into the second dielectric material 20. In the embodiments in which the profile control liner is a dielectric material, the transferring of the line pattern into the second dielectric material directly provides the structures that are shown in FIGS. 9A-9B.

The transferring of the line pattern 28 into the second dielectric material 20 includes an etching process such as, for example, reactive ion etching, plasma etching, and ion beam etching. In the embodiment in which the profile control liner is metallic, the etching process employed at this stage of the present disclosure removes a portion of the profile control liner 32, a portion of the dielectric hard mask material 26 and a portion of the second dielectric material 20 that is located between adjacent via openings 31A, 31B. As shown in FIGS. 8A-8B, the profile control liner 32 within each via opening 31A, 31B prevents rounding of the corners of a second dielectric material portion 20A that is present between adjacent vias openings 31A, 31B. The second dielectric material portion 20A that is present between adjacent vias openings 31A, 31B has sidewall surfaces that are protected by a remaining portion of the profile control liner 32, while the upper surface of the second dielectric material portion 20A is bare. As shown, the line opening 29 is located above and in connected with each via opening 31A, 31B. It also noted that during this step of the present disclosure, no profile control liner 32 is present on any surfaces of the second dielectric material 20 within the line opening 29.

Figure 9A:
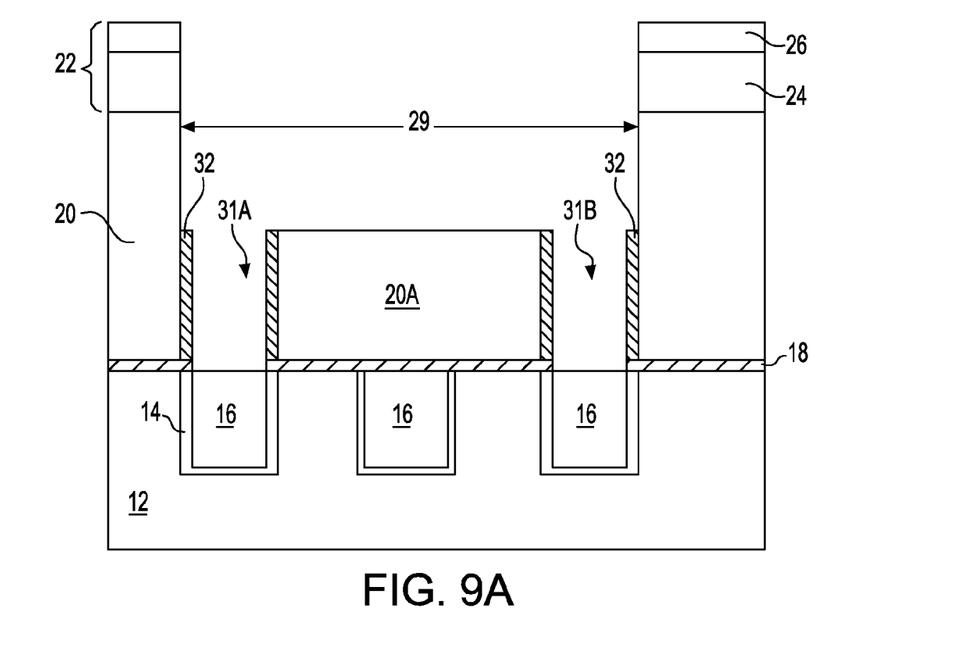
FIG. 9A is a pictorial representation (through a cross sectional view) illustrating the structure of FIG. 8A after removing a portion of the profile control liner from a bottom portion of each via opening and an underlying portion of the dielectric capping layer.

Referring to FIG. 9A, there is illustrated the structure of FIG. 8A after removing a portion of the profile control liner 32 from a bottom portion of each via opening 31A, 31B and an underlying portion of the dielectric capping layer 18. It is again emphasized that when the profile control liner is a dielectric material, the transferring of the line pattern 28 into the second dielectric material 20 provides the structures shown in FIGS. 9A and 9B without having to do any further etching as is the case for embodiments in which the profile control liner is a conductive material.

Figure 9B:
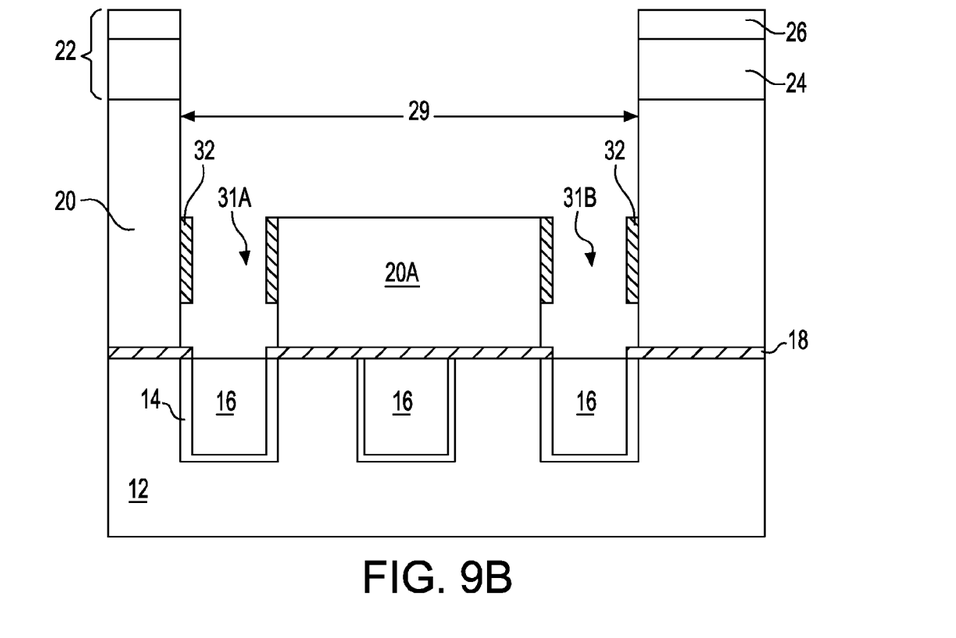
FIG. 9B is a pictorial representation (through a cross sectional view) illustrating the structure of FIG. 8B after removing a portion of the profile control liner from a bottom portion of each via opening, a portion of the second dielectric capping layer and an underlying portion of the dielectric capping layer.

In some embodiments and as shown in FIG. 9B, any remaining portion of the second dielectric material 20 that was left between the bottom surface of each via opening 31A, 31B and the upper surface of the dielectric capping layer 18 can also be removed at this point of the present disclosure. In each of the illustrated structures, an exposed surface of the underlying region of conductive material 16 is now exposed at the bottom of the each via opening 31A, 31B.

The removal of the portion of the profile control liner 32 from a bottom portion of each via opening 31A, 31B, the removal of any remaining portion of the second dielectric material 20 located between the bottom surface of the each via opening 31A, 31B and the dielectric capping layer 18, and removal of the underlying portion of the dielectric capping layer 18 may be performed utilizing one or more etching steps. The one or more etching steps may comprise a dry etching process such as, for example, reactive ion etching, ion beam etching, or plasma etching. Typically, and in one embodiment, the one or more etching steps comprise a reactive ion etch.

In one embodiment, the removal of a portion of the profile control liner 32 from a bottom portion of each via opening 31A, 31B may comprise a physical ion bombardment process. In one embodiment, the removal of the remaining portions of the second dielectric material 20 located between the bottom surface of the each via opening 31A, 31B and the dielectric capping layer 18 may comprise anisotropic reactive ion etching. In one embodiment, the removal of the underlying portion of the dielectric capping layer 18 may comprise an anisotropic reactive ion etch. It is noted that when the via openings 31A, 31B do not extend entirely through the second dielectric material 20, this step of the present disclosure will expose a sidewall portion of the second dielectric material which is positioned beneath the remaining profile control liner 32 and the dielectric capping layer 18.

It is again emphasized the embodiments of the present disclosure in which the profile control liner is a dielectric material, the profile control liner 32 is removed from via bottom during the line etch, together with any underlying second dielectric material and underlying capping layer providing the structure shown in FIGS. 9A-9B directly.

Figure 10A:
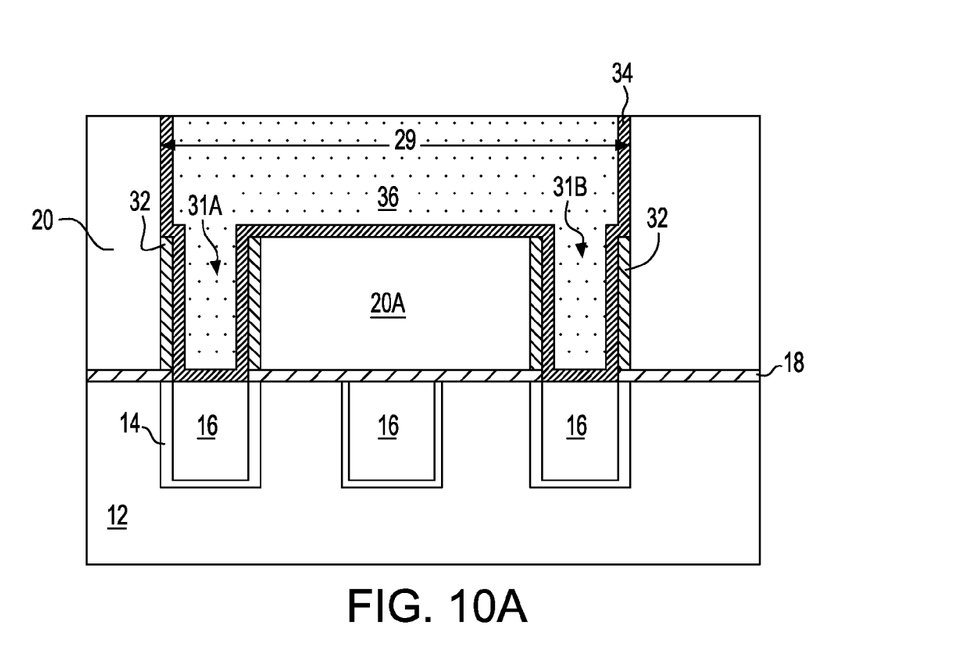
FIG. 10A is a pictorial representation (through a cross sectional view) illustrating the structure of FIG. 9A after forming a diffusion barrier and a conductive material within each via opening and line opening and planarizing.
Figure 10B:
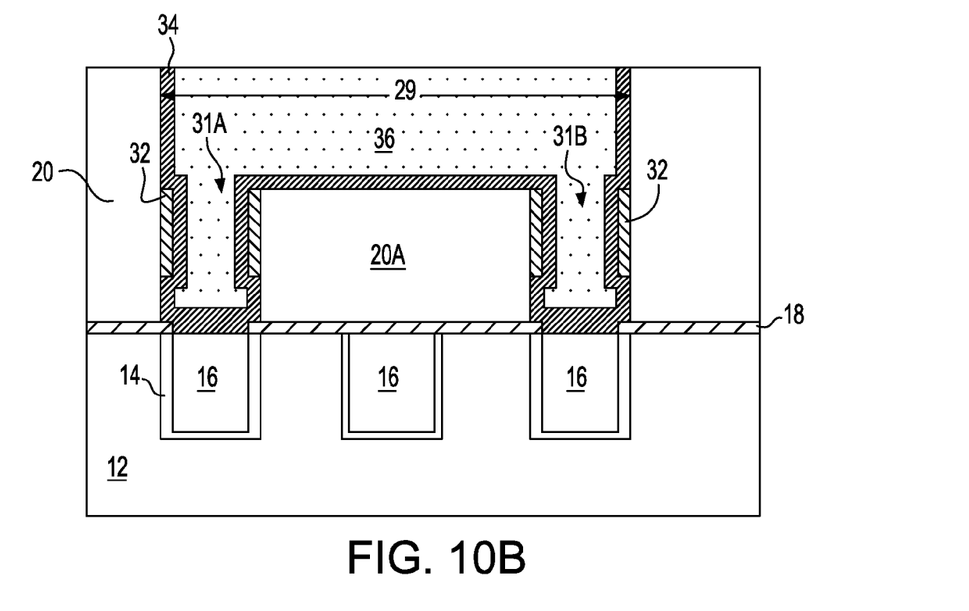
FIG. 10B is a pictorial representation (through a cross sectional view) illustrating the structure of FIG. 9BA after forming a diffusion barrier and a conductive material within each via opening and line opening and planarizing.

Referring now to FIGS. 10A-10B, there are illustrated the structures of FIGS. 9A and 9B, respectively, after forming a diffusion barrier 34 and a conductive material 36 within each via opening 31A, 31A and line opening 29 and planarizing. After planarization, the via openings 31A, 31B and the line opening 29 are filled with conductive material 36 providing conductively filled vias and a conductively filled line within the second dielectric material 20.

Diffusion barrier 34 that is formed within each via opening and line opening may comprise one of the materials mentioned above for diffusion barrier 14. Diffusion barrier 34 can be formed utilizing one of the techniques mentioned above for forming diffusion barrier 14. Also, diffusion barrier 34 can have a thickness within one of the ranges mentioned above for diffusion barrier 14.

In some embodiments (now shown), an optional plating seed layer can be formed on an exposed surface of the diffusion barrier 34 prior to forming the conductive material. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

The conductive material 36 that is formed within each via opening and line opening may be formed by a deposition process including chemical vapor deposition (CVD), plasma enhanced chemical vapor deposition (PECVD), sputtering, chemical solution deposition or plating that fills the first and second interconnect patterns from the bottom upwards. In one embodiment, a bottom-up plating process is employed in forming the conductive material. The conductive material 36 that may comprise polySi, SiGe, a conductive metal, an alloy comprising at least one conductive metal, a conductive metal silicide or combinations thereof. In one embodiment, the conductive material 36 is a conductive metal such as Cu, W or Al. In another embodiment, the conductive material 36 is Cu or a Cu alloy (such as Cu—Al).

Following the deposition of the conductive material 36 and the diffusion barrier 34, a planarization process such as, for example, chemical mechanical polishing (CMP) and/or grinding, can be used to the structure shown, for example, in FIG. 10A or 10B. As shown, the planarization removes all material, including, portions of the conductive material 36, portions of the diffusion barrier 34, portions of he optional plating seed layer, the metal mask material 26, and the dielectric hard mask material 24 which are present on the upper horizontal surface of the second dielectric material 20.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An interconnect structure comprising:
   a dielectric material comprising a via opening and a line opening, wherein said line opening is located above and connected to said via opening;
   a profile control liner present at least partially on sidewalls of said dielectric material within said via opening;
   a diffusion barrier liner located within said via opening and said line opening; and
   a conductive material located within remaining portions of said via opening and said line opening, wherein a portion of said conductive material within at least one portion of said via opening is separated from said dielectric material by a portion of said profile control liner and a portion of said diffusion barrier liner, and wherein another portion of said conductive material within a lower portion of said via opening is separated from said dielectric material by only another portion of said diffusion barrier liner.

2. The interconnect structure of claim 1, wherein said dielectric material comprises a low dielectric constant material.

3. The interconnect structure of claim 2, further comprising an intersection of said via opening and said line opening wherein said intersection substantially lacks chamfering of said dielectric material.

4. The interconnect structure of claim 1, wherein said profile control liner is absent from any surface of said dielectric material present in said line opening.

5. The interconnect structure of claim 1, wherein a portion of said profile control liner extends onto vertical sidewalls of said dielectric material within said line opening.

6. The interconnect structure of claim 1, wherein said profile control liner includes one of Ta, TaN, Ti, TiN, Ru, RuN, RuTa, RuTaN, IrTa, IrTaN, W and WN.

7. The interconnect structure of claim 1, wherein said profile control liner comprises one of silicon dioxide, silicon nitride and silicon oxynitride.

8. The interconnect structure of claim 1, wherein a dielectric material portion is located between said via opening and an another via opening, wherein a sidewall of said dielectric material portion located within said via opening and said another via opening includes said profile control liner present thereon, and wherein said profile control liner is absent from a horizontal surface of said dielectric material portion.

9. The interconnect structure of claim 1, wherein a bottommost horizontal surface of said diffusion barrier liner within said via opening is in direct physical contact with a topmost surface of a conductive material that is present in an underlying dielectric material.

10. The interconnect structure of claim 1, wherein a bottommost surface of said profile control liner is in direct physical contact with a portion of said diffusion barrier liner that is in direct physical contact with a sidewall of said dielectric material in a lower portion of said via opening.

11. The interconnect structure of claim 10, wherein a topmost surface of said profile control liner is in direct physical contact with another portion of said diffusion barrier that is present along a sidewall of said dielectric material in said line opening.

12. The interconnect structure of claim 1, wherein said topmost surface of said profile control liner is vertically offset and located between a topmost surface of said dielectric material, said topmost surface of said dielectric material is coplanar to a topmost surface of said diffusion barrier liner and a topmost surface of said conductive material.

* * * * *